United States Patent [19]
Jenkins

[11] Patent Number: 6,034,321
[45] Date of Patent: Mar. 7, 2000

[54] DOT-JUNCTION PHOTOVOLTAIC CELLS USING HIGH-ABSORPTION SEMICONDUCTORS

[75] Inventor: Phillip P. Jenkins, Cleveland Hts., Ohio

[73] Assignee: Essential Research, Inc., Cleveland, Ohio

[21] Appl. No.: 09/046,529

[22] Filed: Mar. 24, 1998

[51] Int. Cl.$^7$ .................. H01L 31/05; H01L 31/052; H01L 31/072

[52] U.S. Cl. ............... 136/252; 136/255; 136/256; 136/261; 136/262; 136/253; 257/436; 257/437; 257/459; 257/461; 257/465; 438/83; 438/98; 438/57

[58] Field of Search ..................... 136/252, 255, 136/256, 261, 262, 253; 257/436, 437, 459, 461, 465; 438/83, 98, 57

[56] References Cited

U.S. PATENT DOCUMENTS

| | | |
|---|---|---|
| Re. 30,384 | 8/1980 | Kaplow et al. . |
| 3,874,952 | 4/1975 | Woodall . |
| 3,903,427 | 9/1975 | Pack . |
| 3,990,101 | 11/1976 | Ettenberg et al. . |
| 3,995,303 | 11/1976 | Nahory et al. . |
| 4,107,723 | 8/1978 | Kamath . |
| 4,110,122 | 8/1978 | Kaplow et al. . |
| 4,133,698 | 1/1979 | Chiang et al. . |
| 4,135,950 | 1/1979 | Rittner . |
| 4,234,352 | 11/1980 | Swanson . |
| 4,295,002 | 10/1981 | Chappell et al. . |
| 4,320,247 | 3/1982 | Gatos et al. . |
| 4,332,974 | 6/1982 | Fraas . |
| 4,379,944 | 4/1983 | Borden et al. . |
| 4,427,841 | 1/1984 | Rahilly . |
| 4,453,030 | 6/1984 | David et al. . |
| 4,582,952 | 4/1986 | McNeely et al. . |
| 4,703,337 | 10/1987 | Yamazaki . |
| 5,011,550 | 4/1991 | Konushi et al. . |
| 5,028,274 | 7/1991 | Basol et al. . |
| 5,030,295 | 7/1991 | Swanson et al. ............ 136/256 |
| 5,100,480 | 3/1992 | Hayafuji . |
| 5,115,286 | 5/1992 | Camras et al. . |
| 5,239,193 | 8/1993 | Benton et al. . |
| 5,266,125 | 11/1993 | Rand et al. . |
| 5,286,306 | 2/1994 | Menezes . |
| 5,322,573 | 6/1994 | Jain et al. . |
| 5,342,451 | 8/1994 | Virshup . |
| 5,407,491 | 4/1995 | Freundlich et al. . |
| 5,538,564 | 7/1996 | Kaschmitter . |
| 5,571,339 | 11/1996 | Ringel et al. . |
| 5,595,607 | 1/1997 | Wenham et al. . |
| 5,602,415 | 2/1997 | Kubo et al. . |
| 5,641,362 | 6/1997 | Meier ....................... 136/256 |

OTHER PUBLICATIONS 25.5–Percent AMO Gallium Arenside Grating Solar Cell (V.G. Weizer and M.P. Godlewski) Oct., 1985 (NASA Technical Memorandum 87134).

Monolithically Interconnected InGaAs TPV Module Development (David M. Wilt et al) 25th PVSC; May 13–17, 1996 (0–7–803–3166–4/96 IEEE).

Effect of solar–cell junction geometry on open–circuit voltage (V.G. Weizer and M.P. Godlewski), J. Appl. Phys. 57(6), Mar. 15, 1985.

(List continued on next page.)

*Primary Examiner*—Alan Diamond
*Attorney, Agent, or Firm*—Fay, Sharpe, Fagan, Minnich & McKee, LLP

[57] ABSTRACT

A dot-junction photovoltaic cell using high absorption semiconductors increases photovoltaic conversion performance of direct band gap semi-conductors by utilizing dot-junction cell geometry. This geometry is applied to highly absorbing materials, including $In_{x-1}Ga_xAs$. The photovoltaic cell configured to be separated into a thin active region and a thick, inactive substrate, which serves as a mechanical support.

11 Claims, 4 Drawing Sheets

OTHER PUBLICATIONS

An Optimization Study of Si Point–Contact Concentrator Solar Cells (R.A. Sinnton and R.M. Swanson) Proceedings of the 19th IEEE Photovoltaics Specialists Conference, pp. 1201–1208, May 4–8, 1987, New Orleans.

Radiation Hardened High Efficiency Silicon Space Solar Cell (V. Garboushian et al. Jan., 1993 (Amonix, Inc.) (0–7803–1220–1/93; 1993 IEEE).

Ion Implantation of Be in $In_{0.53}Ga_{0.47}As$ (K. Tabatabaie–Alavi, et al.) Appl. Phys. Lett. 40(6) Mar. 15, 1982 (American Institute of Physics).

Ion Implantation of Si in Be–implanted $In_{0.53}Ga_{0.47}As$ (A.N.M.M. Choudhury et al.) Appl. Phys. Lett. 40(7), Apr. 1, 1982 (American Institute of Physics).

DOT-JUNCTION PHOTOVOLTAIC CELLS USING HIGH-ABSORPTION SEMICONDUCTORS

BACKGROUND OF THE INVENTION

This invention describes a device structure that produces improved photovoltaic (light to electricity) conversion performance.

Rectifying junctions, such as p/n junctions and Schottky diodes, are fabricated in semiconducting materials to make photovoltaic devices and detectors. A photovoltaic device converts light into electricity. Light illuminates the junction and creates pairs of oppositely charged particles: electrons and holes. These charges are separated by the rectifying junction to produce electrical current. Photodetectors work on a similar principle.

As illustrated in FIG. 1, conventional photovoltaic (PV) cells 10 are planar devices constructed of at least two asymmetrically doped, semiconductor layers 12,14, with front 16 and back 18 contacts. For conventional PV cell 10, light 20 enters between the grid formed by front contacts 16 where it is absorbed by the n-type layer 12 and p-type layer 14 creating electron-hole pairs. The electron-hole pairs are separated by p/n junction 22 and a voltage develops across PV cell 10. Useful power is obtained by putting a load across the cell contacts. PV cells convert radiation directly into useful electric energy.

One factor that limits the conversion efficiency from light to electricity, is reverse current leakage (Io) across p/n junction 22. For a planar cell, Io can be expressed as $Jo*A$, where Jo is the reverse saturation current density in Amps/cm$^2$ and A is the area of the p/n junction in cm$^2$. There are many ways to reduce Jo for a planar cell but whatever methods are used, reduction of Io is fundamentally limited by the area of the junction, A. For a planar cell, reducing A simply means the cell is smaller and thus collects less light. By using a different cell geometry (nonplanar) it is possible to reduce the area of the p/n junction without reducing the total area of the cell.

One successful non-planar geometry is the silicon dot-junction PV cell, as described in U.S. Pat. No. 4,234,352 to Swanson, hereby incorporated by reference. As depicted in FIG. 2, in a dot-junction cell 24, one surface of a silicon substrate 25 has a series of locally doped n+regions 26 and p+ regions 28, regions, such that the area of the doped regions is much less than the total area of dot-junction cell 24. The p+ regions 28 form the p/n junction with the bulk, and the n+ regions 26 form areas of low resistivity for n-type contacts. The doubling up of contacts, both n-type and p-type, on the front surface obscures incoming light 30; therefore the dot-junction geometry is illuminated through the substrate 25.

Previous work has shown that the reduction in Io with a dot-junction device is proportional to the square root of the area of the junction, as described in V. G. Weizer & M. P. Godlewski, J. Appl. Phys. 57 (6), pages 2292 to 2294, Mar. 15, 1985. So, for a cell where the junction area is 1% that of the total cell area, the magnitude of Io will decrease by approximately a factor of ten compared to an equivalent planar device. This increase in device performance has in fact been demonstrated in silicon, as described in R. A. Sinton and R. M. Swanson, Proceedings of the 19th IEEE Photovoltaics Specialists Conference, pages 1201 to 1208, held May 4–8, 1987, New Orleans, LA.

Unfortunately, other materials do not share the properties unique to silicon that allow dot-junction cells to be successful. For dot-junction cell to work, the semiconductor must have the following characteristics:

1) low surface recombination velocity on all free surfaces,
2) long minority-carrier diffusion lengths (much longer than the device thickness),
3) low contact resistivity, and
4) light penetration the entire thickness of the active device.

These restrictions eliminate very promising PV materials, most notably those with direct bandgaps. Direct bandgap semiconductors, such as gallium arsenide (GaAs), absorb light very strongly: 10 to 100 times stronger than silicon. Consequently, light only penetrates a thin layer of the device. If GaAs were to be used in the device described by Swanson, it has been shown that the total device thickness would have to be 2 microns thick for optimal performance compared to 120 microns for a silicon device. The dot-junction geometry using GaAs would exhibit an efficiency under air-mass-zero (AM0) conditions of 25.5%, versus <20% for a planar geometry, as described in V. G. Weizer and M. P. Godlewski, NASA Technical Memorandum 87134, 1985. Unfortunately, a 2 μm thick device would lack the mechanical rigidity needed in a practical device.

$In_{x-1}Ga_xAs$ is a material similar to GaAs, but requires significantly different processing methods. With this invention, $In_{-1}Ga_xAs$ and other direct bandgap semiconductors can be fabricated into PV cells with a dot-junction geometry. The processing of $In_{x-1}Ga_xAs$ differs from GaAs in that it is grown on substrates of different materials, most typically, indium phosphide (InP). In many semiconductor growth systems the growth substrate can have a significantly higher bandgap than the active semiconductor cell therefore it can act as a semi-transparent window layer for the active cell.

The most studied $In_{x-1}G_xAs$ system is the $In_{0.47}Ga_{0.53}As$ alloy, which is latticed matched to indium phosphide (InP) substrates. Because of the lattice matching, high-quality $In_{0.47}Ga_{0.53}As$ layers can be grown epitaxially. Importantly, the 1.34 eV bandgap of the InP substrate is significantly higher than the 0.74 eV bandgap of the $In_{0.47}Ga_{0.53}As$ layer. The $In_{0.47}Ga_{0.53}As$ layer is sensitive to light in the mid infrared (IR) region, but the IR travels through the substrate unattenuated. The substrate is virtually transparent to these wavelengths. Therefore, the $Ino_{0.47}Ga_{0.53}As$ is active, but the substrate is inactive. This makes it possible to fabricate the dot-junction cell geometry successfully.

SUMMARY OF THE INVENTION

The present invention increases photovoltaic conversion performance of direct bandgap semiconductors by utilizing dot-junction cell geometry. The invention allows this geometry to be applied successfully to highly absorbing materials, including $In_{x-1}Ga_xAs$, by separating the cell into a thin active region and a thick, inactive substrate. The substrate merely serves as a mechanical support. Thus a thin, high-performance device can be manufactured with the mechanical rigidity needed for practical applications. It is shown in this disclosure that the separation of the active cell region from an inactive, transparent substrate permits the dot-junction geometry to be used successfully in direct bandgap semiconductors.

DESCRIPTION OF THE PREFERRED EMBODIMENT

Presently, the known $In_{0.47}Ga_{0.53}As$-on-InP system is the most technologically advanced and ideal candidate to demonstrate the transparent substrate, dot-junction cell. Other material systems, such as $Ga_xIn_{x-1}Sb_yAs_{y-1}$-on-GaSb or $In_{x-1}Ga_xAs$-on-GaAs satisfy the criterion of low bandgap active layers on high bandgap substrates. Therefore, they are equally suitable for transparent substrate, dot-junction cells. The only limits on achieving a high quality, transparent substrate, dot-junction cell is the ability to grow a high quality active layer device on the transparent substrate.

Figure 1:
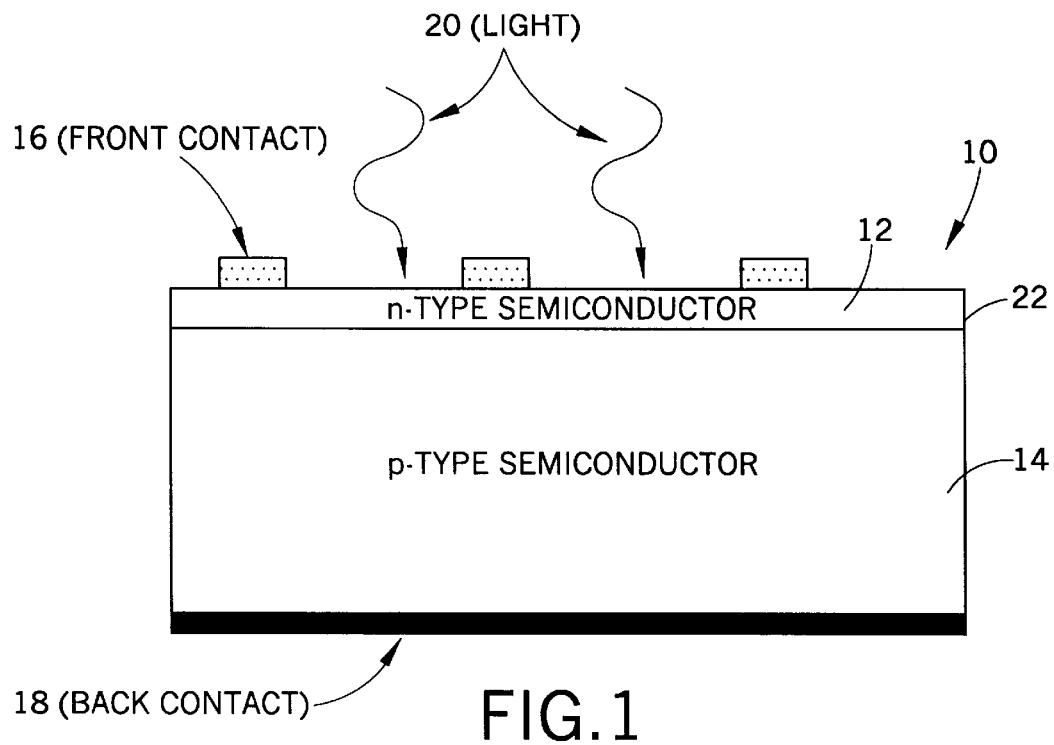
FIG. 1 is a schematic cross-sectional view of a conventional photovoltaic (PV) cell.
Figure 2:
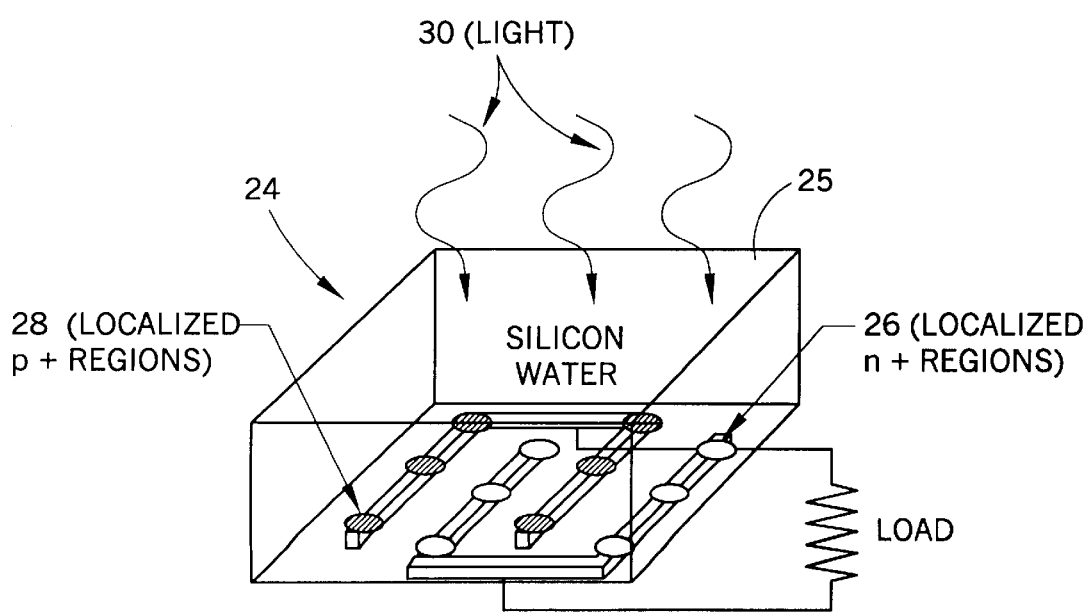
FIG. 2 is a schematic three-quarter view of the silicon dot-junction cell geometry similar to that taught by Swanson.
Figure 3:
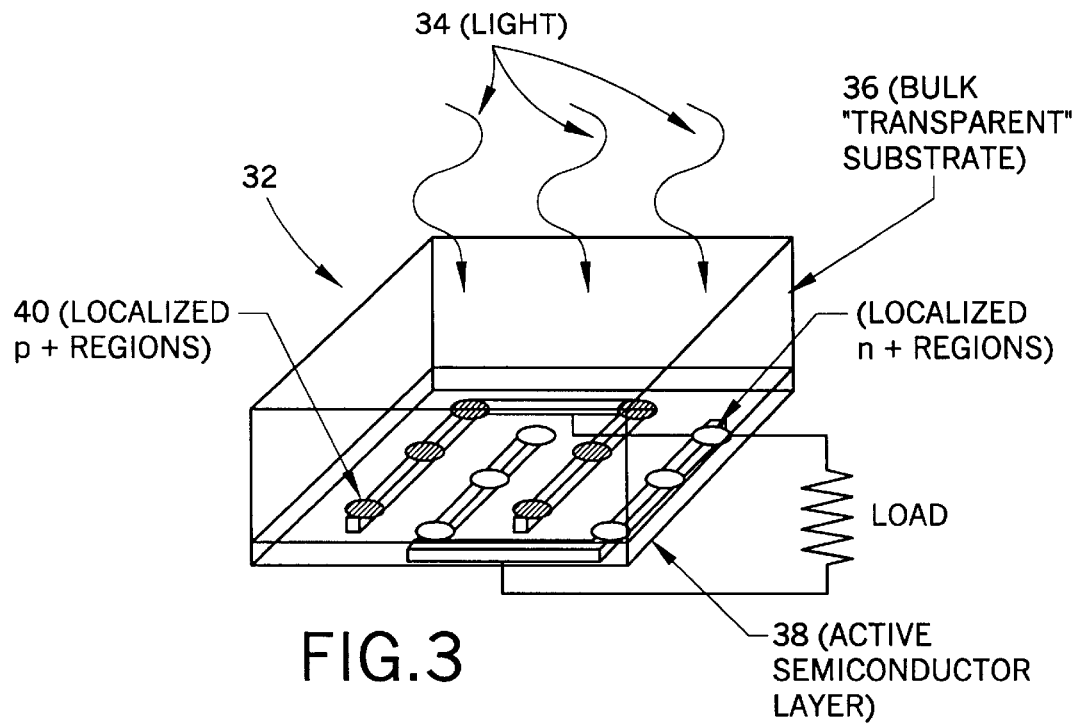
FIG. 3 shows a schematic three-quarter view of the dot-junction geometry utilizing a thin, active layer deposited on top of a thick, inactive substrate.
Figure 4:
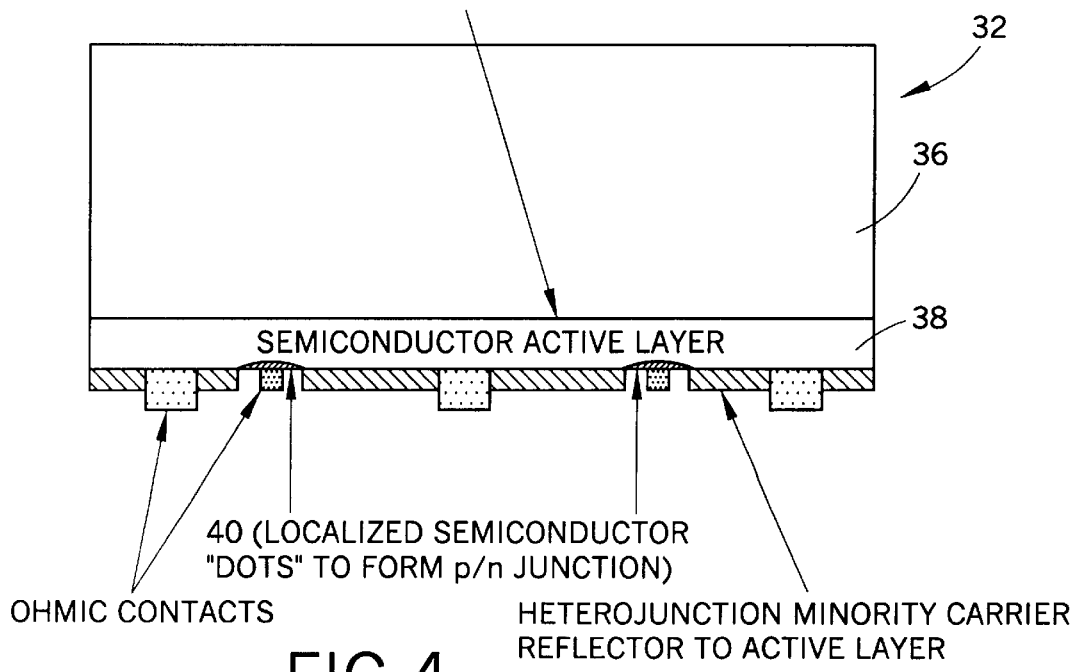
FIG. 4 is a schematic cross-sectional view of the dot-junction geometry utilizing a thin, active layer deposited on top of a thick, inactive substrate.

A suitable dot-junction cell device 32 can be fabricated as shown in FIGS. 3 and 4. Light 34 enters through substrate 36 but is not absorbed until it reaches active $In_{0.47}Ga_{0.53}As$ layer 38. Active layer 38 is thin enough that carriers need only diffuse a short distance before reaching a rectifying contact such as p/n junction 40. It is shown in FIG. 3 that the doped regions form the p/n junction are all interconnected. It is noted the p/n junction may be formed by any one of a heterojunction, ion implantation or dopant diffusion. Further, the p/n junction may be replaced by Schottky barriers. The substrate 36 is completely transparent and electrically inactive; however, it provides the essential mechanical rigidity. Substrate 36 may of a variety of material including any one of gallium arsenide, silicon, germanium, gallium antimonide or indium phosphide. Active layer 38 can be configured from a variety of materials including any one of silicon, gallium arsenide, an indium gallium arsenide alloy, indium arsenide, or an indium gallium antimonide arsenide alloy.

Figure 5:
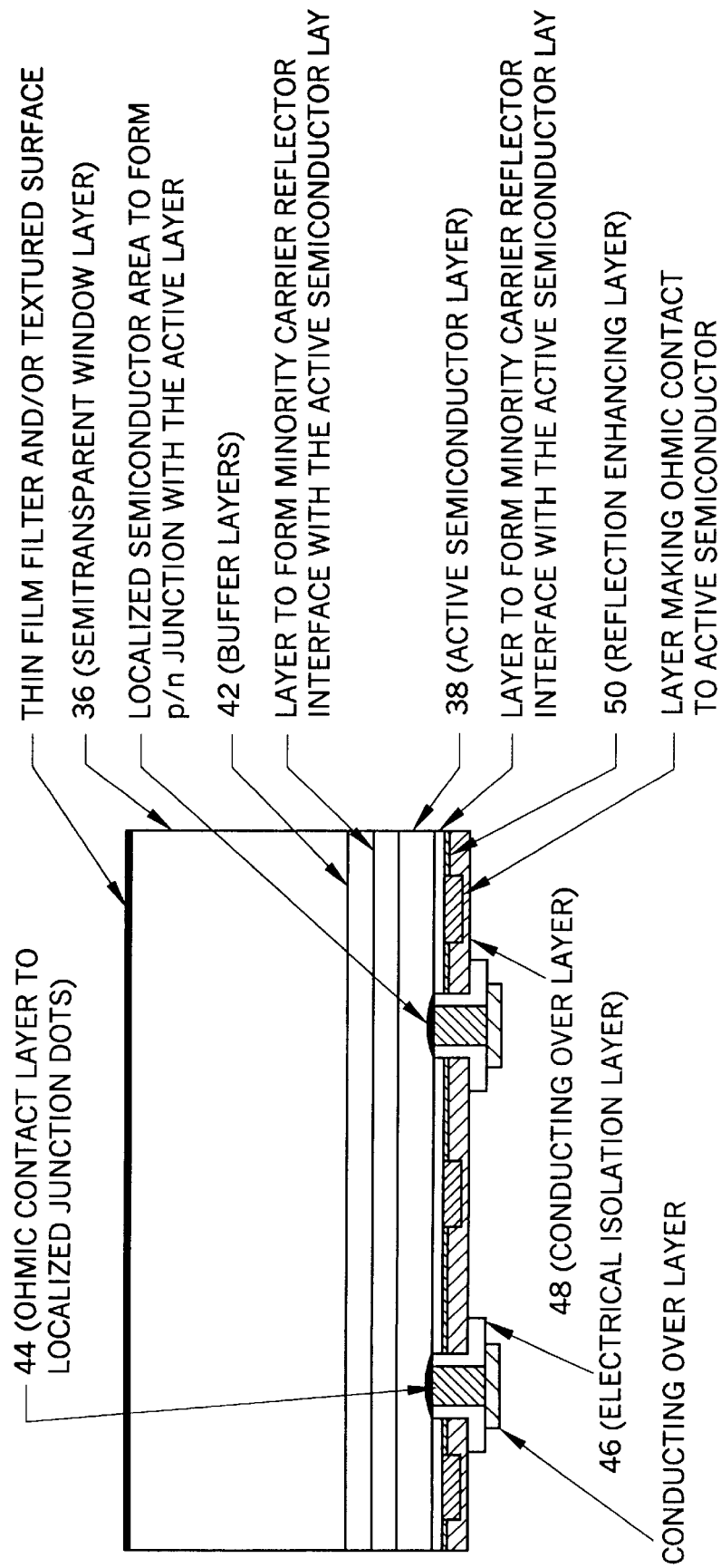
FIG. 5 is a schematic cross-sectional view of a dot-junction cell geometry proposed for InGaAs deposited on top of an InP substrate.

A practical dot-junction cell device will look more like the one detailed in FIG. 5. Buffer layers 42 between substrate 36 and active layer 38 are commonly used to produce high-quality epitaxial layers. To insure isolation between junction contact 44 and active layer 38 region, a dielectric layer 46 between the junction contact metal and the active cell surface is used. Additional metal layers 48 and reflective layers 50 are desirable to improve the overall efficiency of the device. The device can also be configured to use a spectrum shaping coating deposited on at least one surface.

A dot-junction cell using a direct bandgap semiconductor like $In_{x-1}Ga_xAs$ or GaAs, is complicated by the need to have very small features compared to its silicon analog. Previous work indicates that junction dots will need to be on the order of 1 μm in diameter and spaced 10 μm apart, as described in V. G. Weizer and M. P. Godlewski, NASA Technical Memorandum 87134, 1985. These are much smaller features than required for silicon: 16 μm-diam. dots spaced 50 μm apart, as taught in R. A. Sinton and R. M. Swanson, Proceedings of the 19th IEEE Photovoltaics Specialists Conference, page 1201. However, these feature sizes are well within the capability of photolithography methods used to mass produce semiconductor devices.

Figure 6:
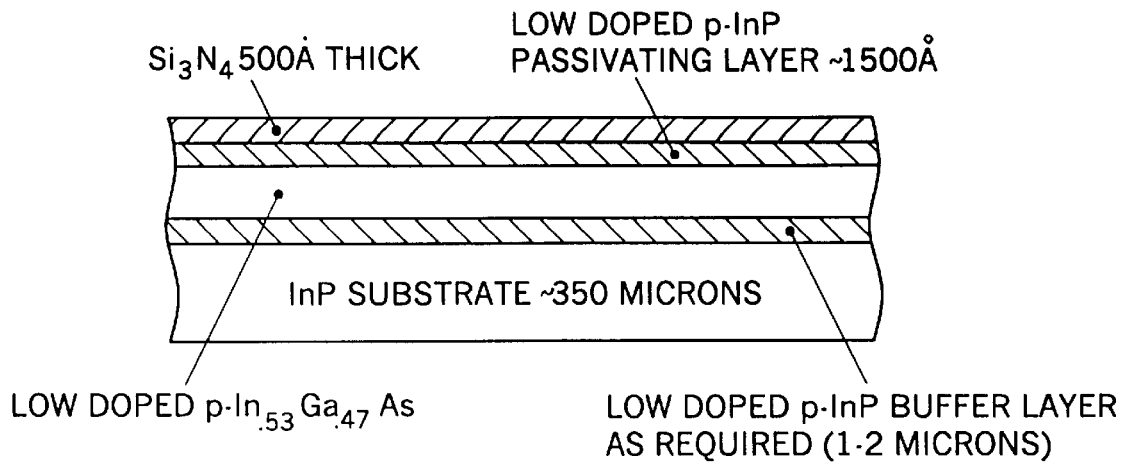
FIG. 6 details a double heterostructure of InP/InGaAs/InP capped with silicon nitride.
Figure 7:
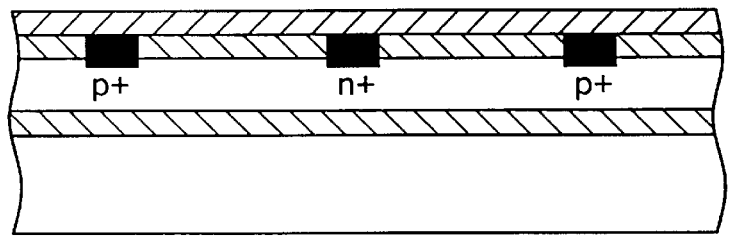
FIG. 7 illustrates a double heterostructure showing ion implanted regions in the InP passivating layer and the active InGaAs layer.

At this time the most practical way to make the presently described device is with a combination of epitaxy and ion implantation techniques. The following is a process flow for a $In_{0.47}Ga_{0.53}As$ dot-junction device:

On a semi-insulating InP substrate, grow a InP/$In_{0.47}Ga_{0.53}As$/InP double heterostructure consisting of a low doped p-type InP buffer layer, a 2.5 micron thick low doped p-type $In_{0.47}Ga_{0.53}As$ layer and a 1500 Å thick low doped p-type InP layer on top (FIG. 6). On top of this structure, deposit a 500 Å layer of silicon nitride or other similar dielectric material. Pattern the heterojunction layers with photoresist to expose 1 micron diameter dots on 10 micron centers and ion implant p+ regions into the $Ino_{0.47}Ga_{0.53}As$. The preceding being known in the art, and as for example shown in U.S. Pat. No. 4,494,995, hereby fully incorporated by reference, or Applied Physics letters Vol. 40(6), Mar. 15, 1982. Next, re-mask with photoresist to expose similar rows of dots between the p+ rows (which for example may have excess carrier concentration of approximately $1 \times 10^{18}/cm^3$ or greater) and ion implant n+ regions (which for example may have excess carrier concentration approximately $1 \times 10^{18} cm^3$ or greater) (see FIG. 7). The preceding steps being known in the art and for example shown in Applied Physics letters Vol. 40(7) and U.S. Pat. No. 4,494,995, Apr. 1, 1982. The next action is to anneal the wafer to activate the dopants as shown in U.S. Pat. No. 4,494,995.

Figure 8:
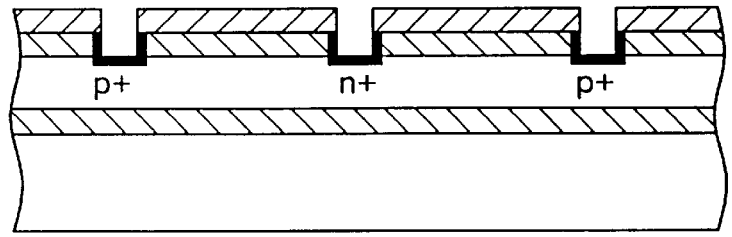
FIG. 8 shows the silicon nitride and InP are etched off over the implanted areas to define ohmic contact regions; and, FIG. 9 depicts evaporated gold/germanium contacts.

Pattern the heterojunction with photoresist to expose dots smaller than the implanted regions and aligned over the doped regions. Etch through the silicon nitride and the InP using reactive ion etching or wet chemical etching techniques (FIG. 8).

Figure 9:
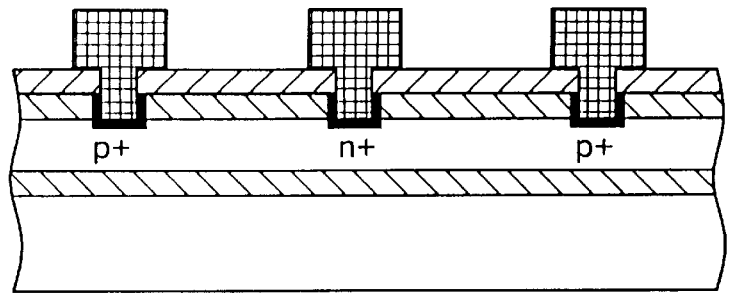

Pattern wafer with photoresist to expose interdigitated fingers and bus bars to connect the n+ regions together and separately, the p+ regions together. Thermally evaporate a 200 Å layer of gold followed by a 250 Å layer of germanium and finally a 2000 Å layer of gold (FIG. 9).

Additional metal overlayers to improve reflectance on the contact side and a front spectral control filter on the substrate surface can be added as required by the specific application.

PV cells are used for energy conversion, single infrared (IR) detectors and imaging array detectors. Low-bandgap (<1 eV) semiconductors will benefit the most from the dot-junction geometry. These devices have very high reverse saturation current densities (Jo) compared to high-bandgap semiconductors such as silicon and GaAs. Dot-junction cells will improve the efficiency of PV cells, and improve the signal-to-noise ratio in infrared detectors. Additionally, dot-junction devices degrade less when operated at high temperatures. Detectors such as InAs are only useful when cooled to temperatures below 0° C. A dot-junction InAs cell will be able to operate at higher temperatures, and will thus be less expensive to use. It is noted that cells grown on the same substrate can be monolithically interconnected.

The transparent substrate, dot-junction cell is ideally suited for thermophotovoltaic (TPV) applications. In most cases, the TPV system design requires the interconnection of large numbers of small cells rather than using a few large cells. For a conventional silicon dot junction cell, multiple cells grown on a single substrate must be mechanically separated (cleaved or sawn) to electrically isolate the cells before interconnecting them. With a transparent substrate, dot-junction cell, individual cells grown on a common substrate can be electrically isolated by etching a trench between cells, down to the transparent substrate. The only requirement is that the substrate must have low electrical conductivity. Multiple cells can be interconnected on the same wafer and a monolithic module can be fabricated. Monolithic interconnection schemes are already used in planar devices as discussed in Wilt, D. et al. Proceedings of the 25th IEEE Photovoltaic Specialists Conference, pp. 43–48, May 13–17, 1996.

We claim:

1. A photovoltaic device comprising:

an electrically inactive semiconductor substrate; and, a thin active layer direct bandgap semiconductor grown directly on the substrate;

wherein said electrically inactive semiconductor substrate and said thin active layer semiconductor combine to have at least three surfaces, a first surface serving as an entrance point for light, a second surface delineating the active photovoltaic cell from the substrate and, a third surface configured with a plurality of rectifying contacts herein the third surface contains at least one electrical contact to a localized rectifying contact and at least one ohmic contact to the active semiconductor layer.

2. A photovoltaic device comprising:

an electrically inactive semiconductor substrate; and, a thin active layer direct bandgap semiconductor grown directly on the substrate;

wherein said electrically inactive semiconductor substrate and said thin active layer conductor combine to have at least three surfaces, a first surface serving as an entrance point for light, a second surface delineating the active photovoltaic cell from the substrate and, a third surface configured with a plurality of doped regions of opposite conductivity type to the active layer to form a p/n junction, wherein the third surface further contains at least one ohmic contact to a localized doped region and at least one ohmic contact to the active semiconductor layer.

3. The device according to claim 2 wherein the p/n junction is formed by at least one of a heterojunction, ion implantation, dopant diffusion and homoepitaxy.

4. The device according to claim 2 further including a buffer layer located between the active layer and the substrate.

5. The device according to claim 2 further including a spectrum shaping coating deposited on at least one surface.

6. The device according to claim 2 further including a reflective layer deposited on the surface containing the doped regions.

7. The device according to claim 2 wherein the doped regions forming the p/n junction are all interconnected, with all the p-type contacts being connected together and all the n-type contacts being connected together.

8. The device according to claim 2 wherein the at least one ohmic contact to the active semiconductor layer includes a plurality of doped regions interleaved with the junction forming doped regions.

9. The device according to claim 2 wherein the substrate is at least one of gallium arsenide, silicon, germanium, gallium antimonide and indium phosphide.

10. The device according to claim 2 wherein the active layer direct bandgap semiconductor is at least one of gallium arsenide, an indium gallium arsenide alloy, indium arsenide, and an indium gallium antimonide arsenide alloy.

11. The device according to claim 2 wherein the inactive semiconductor substrate is radiation transparent.

* * * * *